(12) United States Patent
Ravazzi et al.

(10) Patent No.: US 6,369,406 B1
(45) Date of Patent: Apr. 9, 2002

(54) METHOD FOR LOCALIZING POINT DEFECTS CAUSING LEAKAGE CURRENTS IN A NON-VOLATILE MEMORY DEVICE

(75) Inventors: Leonardo Ravazzi, Dalmine; Lorenzo Fratin, Buccinasco, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/311,258

(22) Filed: May 13, 1999

(30) Foreign Application Priority Data

May 21, 1998 (IT) .......................... MI98A1123

(51) Int. Cl.[7] .......................... H01L 23/58; G11C 16/04
(52) U.S. Cl. ................ 257/48; 365/185.11; 365/185.13
(58) Field of Search ....................... 257/48; 365/185.11, 365/185.13

(56) References Cited

U.S. PATENT DOCUMENTS 5,315,541 A * 5/1994 Harari et al. .......... 365/185.13
5,523,976 A * 6/1996 Okazawa et al. ........... 365/200

* cited by examiner

Primary Examiner—Olik Chaudhuri
Assistant Examiner—Howard Weiss
(74) Attorney, Agent, or Firm—Wolf, Greenfield & Sacks, P.C.; James H. Morris (57) ABSTRACT

Method for localizing point defects causing column leakage currents in a non-volatile memory device including a plurality of memory cells arranged in rows and columns in a matrix structure, source diffusions, and metal lines which connect said source diffusions to each other. Such a method includes the steps of: modifying the memory device in order to make source diffusions independent of each other and each one electrically connected to a respective row; sequentially biasing the single columns of the matrix; localizing the column to which at least one defective cell belongs, as soon as the leakage current flow occurs in the biased column; by keeping biased the localized column, biasing sequentially the single rows of the matrix to the same potential as that of the localized column; localizing a couple of cells, wherein at least one of them involves the point defects, as soon as the leakage current flow does not occur.

10 Claims, 8 Drawing Sheets

METHOD FOR LOCALIZING POINT DEFECTS CAUSING LEAKAGE CURRENTS IN A NON-VOLATILE MEMORY DEVICE

BACKGROUND OF THE INVENTION

1. Field of the Invention

The present invention relates to a method and apparatus for localizing point defects causing column leakage currents (IL) between drains and sources, by means of source diffusion addressing in a conventional non-volatile memory device.

2. Discussion of the Related Art

In non-volatile memories, sometimes there are defects causing column (bit line) leakage currents, independent of the voltage applied to the gate electrode (word line). Such leakage currents can be caused by one or more defective contacts or by a conductive path between the drain electrode and the source electrode, e.g. in the silicon substrate, of one or more cells connected to the bit line wherein the above-mentioned leakage currents appear, as well as by contact-polysilicon or metal levels short-circuits, which depend on the particular device.

The use of failure analysis, usually long and delicate, is made extremely hard due to the practical impossibility of localizing the cell in which the leakage defect is located, because all the drain electrodes of the cells connected to the bit line at issue have the same potential value and also all the source electrodes of the matrix cells are short-circuited to each other by means of metal lines.

Figure 1:
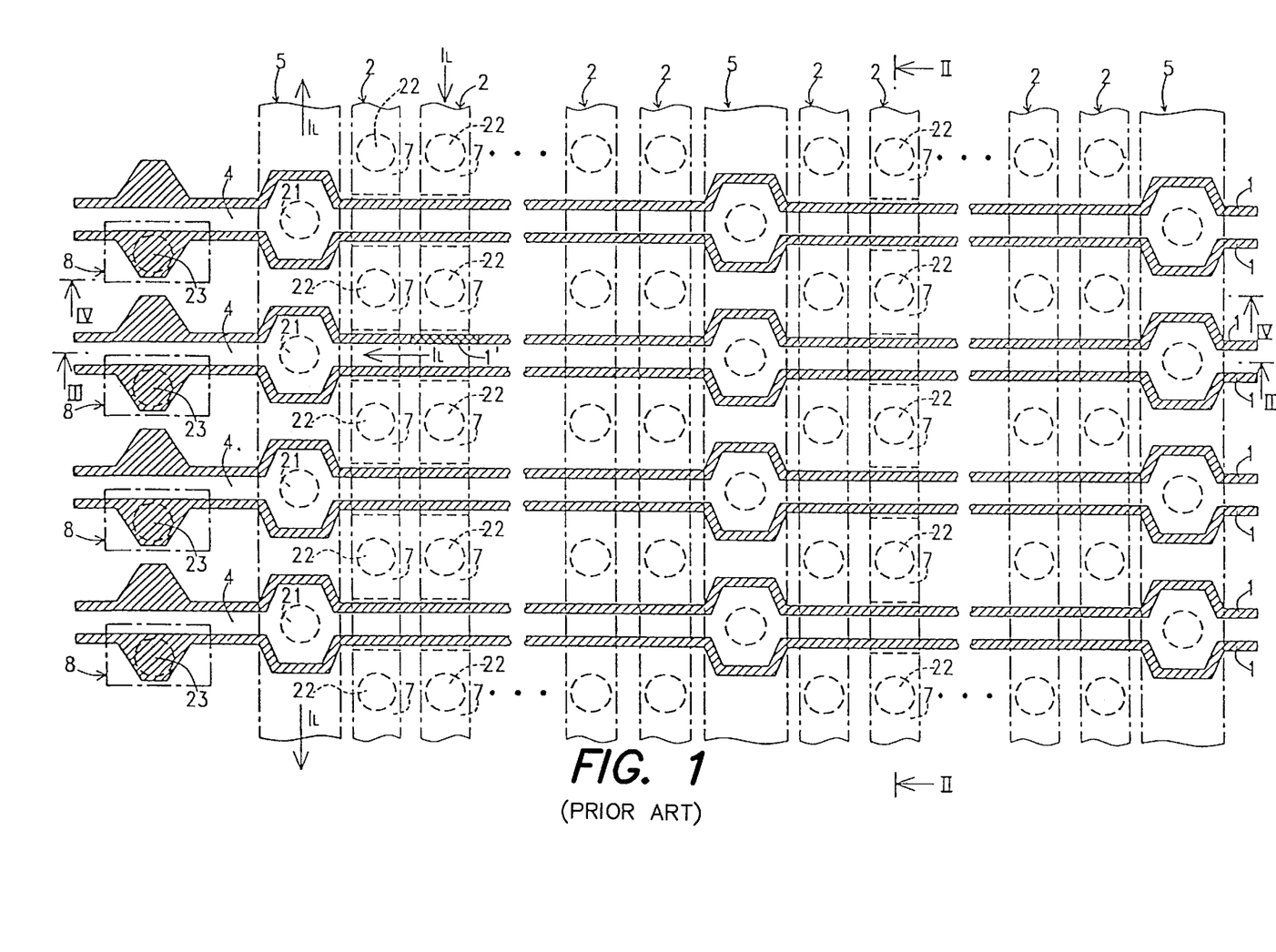
FIG. 1 shows schematically a top view of a matrix of non-volatile memory cells, according to the prior art.

FIG. 1 schematically shows a top view of a matrix portion of memory cells according to the prior art, arranged in couples of rows (word lines 1) and in columns (bit lines 2). To the word lines 1 correspond common source lines (source diffusions 4), which, through source contacts 21, are connected to each other by source metal lines 5 arranged at regular intervals between matrix columns. The bit lines 2 connect, in their turn, respective drain regions 7 lines to each other, through drain contacts 22. Insulating oxide layers, not shown in FIG. 1, are interposed between the numerous source and drain regions and the related contacts. The presence of a defective memory cell (notable by means of the different representation 1" in its word line) causes the flow of a leakage current IL.

Moreover, bump contacts (made of metal pad) 8 of boot-strap circuits, located in proper places of the device, which, through contacts 23, are connected to respective word lines 1, are shown. The bump contacts 8 are then connected to metal lines, not shown in FIG. 1, extending parallel to the word lines 1.

Figure 2:
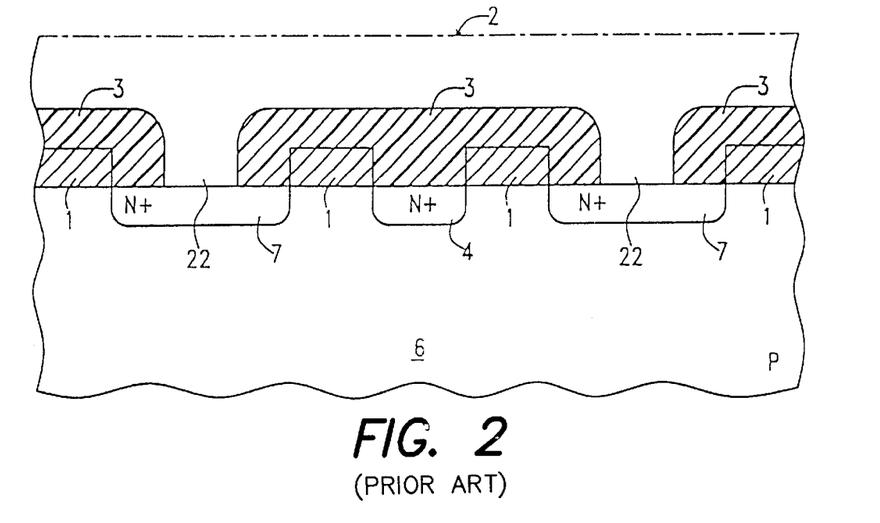
FIG. 2 shows a section view taken along line II—II of FIG. 1.

FIG. 2 schematically shows the section view taken along line II—II of FIG. 1: on a P type substrate 6 there are N+type silicon regions, corresponding alternatively to source regions 4 and to drain regions 7, gate lines or word lines 1, insulating oxide layers 3, and a bit line 2 connected to the N+drain regions 7 through contacts 22.

Figure 3:
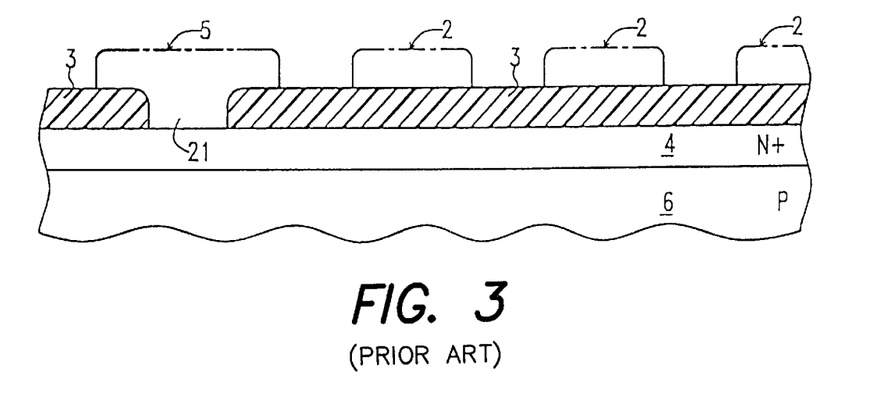
FIG. 3 shows a section view taken along line III—III of FIG. 1.

In FIG. 3, showing schematically a section view taken along line III—III of FIG. 1, it can be noted the metal 5 connected to a N+type silicon layer corresponding to a source diffusion 4, disposed on the P type substrate 6, and a insulating oxide layer 3 on which some bit lines 2 are disposed. The metal 5 is connected to all the source diffusions through contacts 21.

Figure 4:
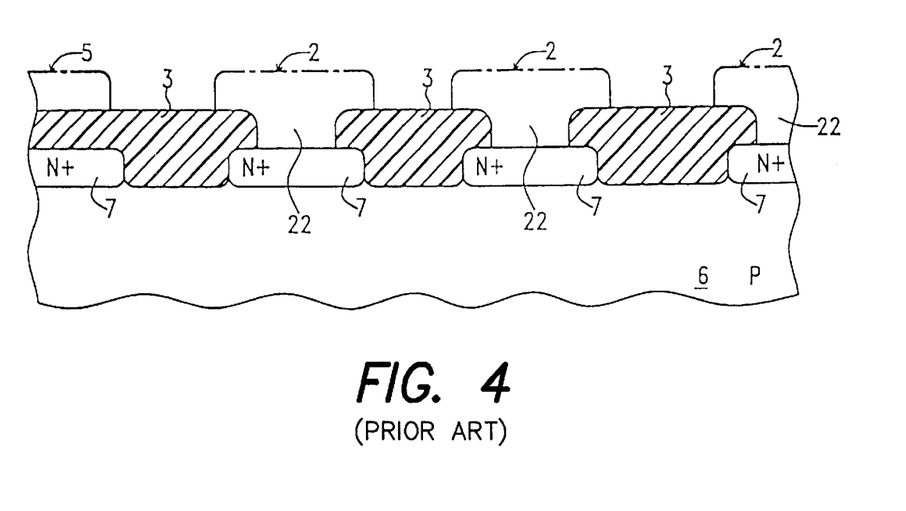
FIG. 4 shows a section view taken along line IV—IV of FIG. 1.

FIG. 4 represents a section view taken along line IV—IV of FIG. 1, showing the metal 5 and the bit lines 2, these last connected through electrodes 22 to their respective N+type silicon regions 7 formed over the P type substrate 6, and spaced apart by means of insulating oxide regions 3.

Figure 5:
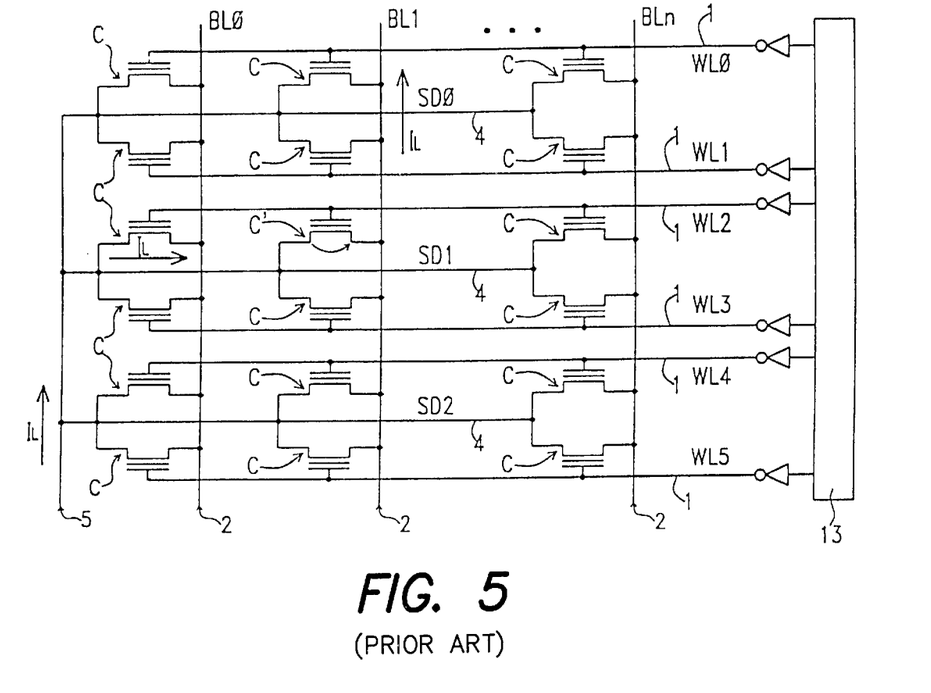
FIG. 5 shows a circuit diagram of the matrix of FIG. 1.

FIG. 5 schematically shows a circuit diagram of the same matrix of FIG. 1, wherein the single memory (C) cells, constituted by N channel MOSFETs, with their related word lines 1 (WL0–WL5), bit lines 2 (BL0–BLn) and source diffusions 4 (SD0–SD2), these last connected to each other by means of metal 5, are more evident. The word lines 1 are addressed by a proper row decoder 13. The presence of the defective cell C' causes the leakage current IL flow in the bit line BL1 wherein said cell is, in the related source diffusion SD1 and in the metal line 5.

Figure 6:
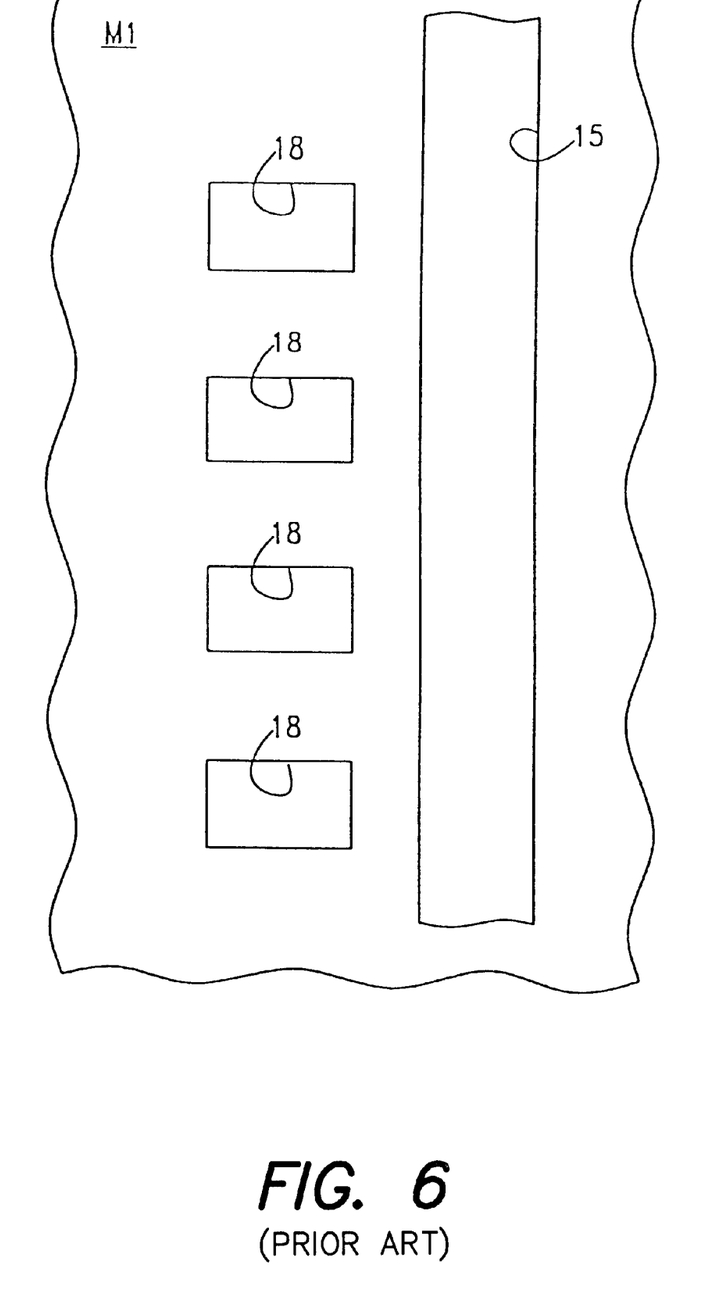
FIG. 6 shows the layout of a metal mask of a portion of the matrix of FIG. 1.

FIG. 6 shows the layout of a metal mask M1 of a portion of the matrix of FIG. 1, used in a manufacturing process step of the memory device, subsequent to that of forming the source 4 and drain 7 regions, the word lines 1 and bit lines 2, wherein the source metal lines 5 are formed, by means of proper openings 15, and the possible bump contacts 8 of the boot-strap circuits by means of proper openings 18.

With a memory cells matrix structured as above-mentioned, the localization of the leakage defect refers to the bit line in which the defective cell (placed in transistor C' of FIG. 5) is inserted, without a possible further localization inside the bit line itself, because of the connection of all the source electrodes of the memory cells: in a fault analysis process, in fact, by biasing the bit line wherein the possible defective cell is, e.g. at 1 V, it can be always noted a leakage current IL flow whatever it might be the voltage applied to the word lines.

To address the problem of localizing a possible leakage defect in one or more memory matrix cells, two preliminary concepts can be considered:

- a leakage current variation can be obtained simply by biasing the source; particularly, if the bit line in which the leakage current flow occurs is biased to a determined drain voltage, usually 1 V, by biasing all the source diffusions to the same potential, the leakage current is canceled;
- if it is possible to bias separately the single source diffusions, the cancellation of the leakage current occurs when the source diffusion of the cell producing leakage is biased to 1 V; by contrast, the bias of the other source diffusions does not produce any effect on the leakage current. In this way the indetermination of defect localization is reduced from all the cells constituting a determined bit line (some hundreds or thousands according to the device) to the two only cells of the bit line which have the common source diffusion biased in a proper manner.

At this point it could be thought of manufacturing a device ad hoc wherein the single source diffusions are decoded separately, like the word lines and the bit lines, but this would involve completely redesigning the device and the device would have a larger size. The mask set of such a device would be completely different compared to a conventional one, and the decision of using such a possibility should be taken as soon as the lot to be worked goes into production.

In view of the state of the art described, it is an object of the present invention to provide a method and apparatus for localizing point defects causing leakage currents in a non-volatile memory device that requires modifying only a minimum number of masks during the manufacturing process of the device itself.

SUMMARY OF THE INVENTION

According to the present invention, this and other objects are achieved by means of a method for localizing point defects causing column leakage currents in a non-volatile memory device, said device comprising a plurality of memory cells arranged in rows and columns in a matrix structure, source diffusions, and metal lines which connect said source diffusions to each other, comprising the steps of: modifying said memory device in order to make said source diffusions independent of each other and each one electrically connected to a respective row; sequentially biasing the single columns of said matrix; localizing the column to which at least one defective cell belongs, as soon as said leakage current flow occurs in the biased column; by keeping biased said localized column, biasing sequentially said single rows of said matrix to the same potential as that of said localized column; localizing a couple of said cells, wherein at least one of them involves said point defects, as soon as said leakage current flow does not occur.

BRIEF DESCRIPTION OF THE DRAWINGS

The features and advantages of the present invention will be made more evident by the following detailed description of two particular embodiments thereof, illustrated as non-limiting examples in the annexed drawings, wherein.

DETAILED DESCRIPTION

Figure 7:
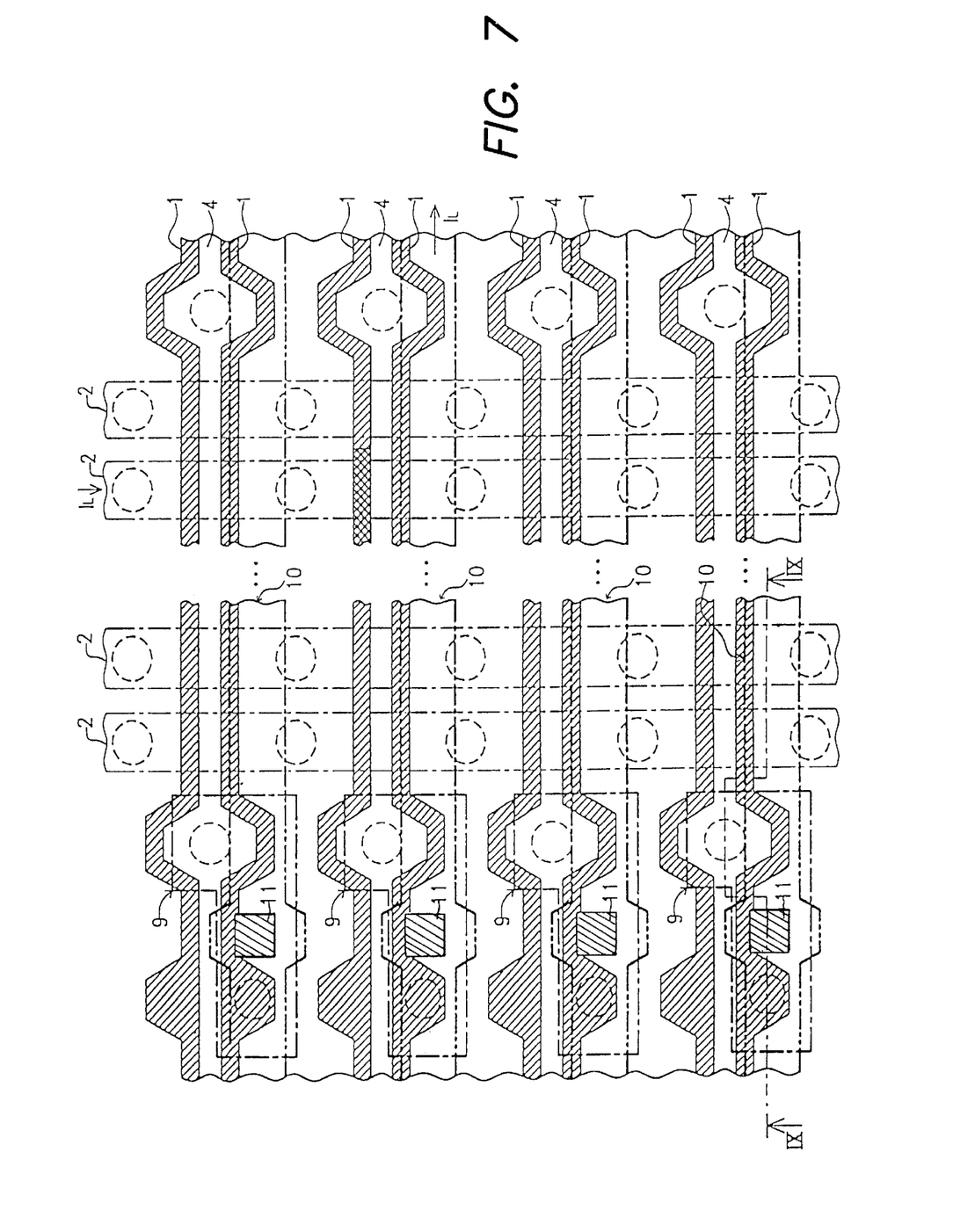
FIG. 7 shows schematically a top view of the same matrix of FIG. 1, modified according to a first embodiment of the present invention.

FIG. 7 shows schematically the top view of the same portion of the memory matrix of FIG. 1 obtained by modifying the mask M1 of the metal 5 according to a first embodiment of the present invention. The proposed solution exploits the presence of the boot-strap structures, in fact the source metal line 5 is eliminated so that all the source diffusions 4 are independent of each other, and moreover the bump contacts 8, that connect the word lines to the boot-strap metal lines 10 (which extend parallel to the word lines and serve to reduce their total resistance) are deformed in order to form metal lines 9 for allowing the connection of the desired word line to its respective first source contact available; the metal lines 9 and 10 are connected to each other through a respective conductive element (VIAS 11). Each source diffusion is then independent of the others and it is electrically connected to a single word line: at this point, by biasing the desired word line, keeping the others to ground, the adjacent source diffusion is biased to the same potential.

Finally, by biasing the bit line wherein the leakage occurs, e.g. at 1 V, if the word line connected to the source diffusion wherein the leakage occurs is biased to the same potential, the leakage current is canceled. By contrast, by biasing the other word lines, and then the source diffusions associated with them, the source diffusion wherein the leakage occurs is kept at ground and therefore the leakage current continues to flow by means of the conductive path between drain and source. The voltage to be applied to the word line connected to the source diffusion must not be too close to the threshold voltage of the cells otherwise all the cells are on.

Figure 8:
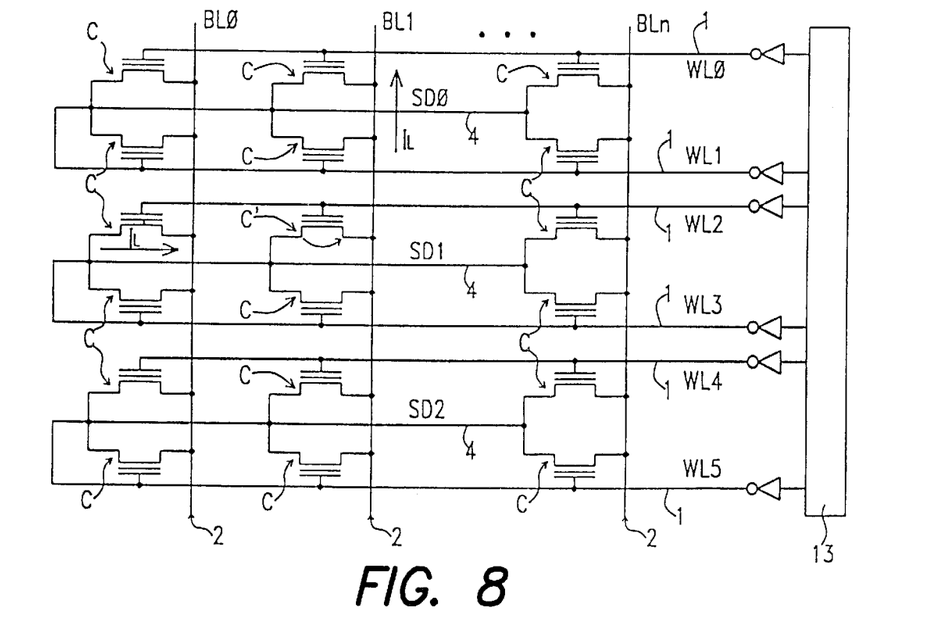
FIG. 8 shows a circuit diagram of the matrix of FIG. 7.

FIG. 8 shows schematically a circuit diagram of the matrix of FIG. 7, to be compared to the circuit diagram of FIG. 5: each source diffusion 4 is independent of the others and it is connected to an associated word line 1. In this case there is a defective cell C' which causes a leakage current IL flow in the bit line BL1 and for localizing it, after biasing the bit line with leakage (e.g. BL1=1 V), all the word lines are biased sequentially (and so the associated source diffusions), by valuing the leakage current in the bit line from time to time, and when the leakage current is zero (in this case when WL3=1 V and the other word lines at ground), the couple of cells wherein leakage occurs is localized (the two cells of the bit line BL1 which have in common the source diffusion SD1, the last associated with the word line WL3). Differently, when the word line of the defective cell is at ground, a leakage current flow always occurs, whatever might be the bias of the other word lines; but by biasing a different bit line and by keeping at ground the bit line with leakage (e.g. BL0=1 V, BL1=0 V), leakage current flow does not occur.

The leakage current can not flow through the removed source metal lines but it can through the word lines, together with the boot-strap metal, and reach the N channel of the decoding inverter.

It can be noted that the word line wherein the bump contact has not been modified maintains its whole functionality.

Figure 9:
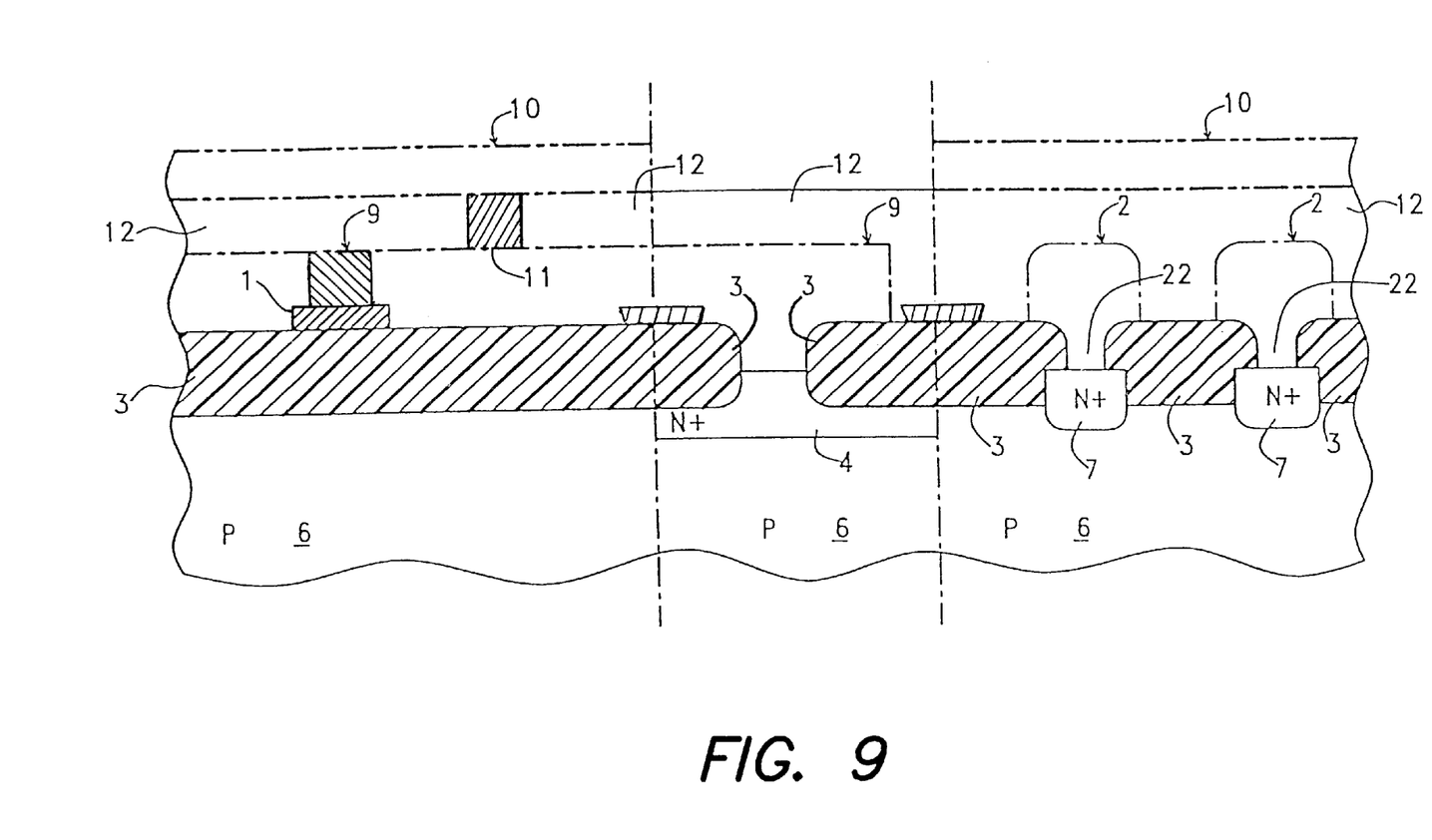
FIG. 9 shows a section view taken along line IX—IX of FIG. 7.

FIG. 9 shows schematically the section view taken along line IX—IX of FIG. 7 wherein the modifications made to the structure of FIG. 1, in order to obtain a structure according to the first embodiment of the present invention, are made more evident: it can be noted the connection of the modified metal line 9 to the word line 1 and, through the VIAS 11, to the metal 10, otherwise separated by a dielectric layer 12.

This solution has the advantage of obtaining a source diffusion decoding by means of word line decoding, acting on the manufacturing process of the memory device, only by modifying the manufacturing mask of the metal 5.

Figure 10:
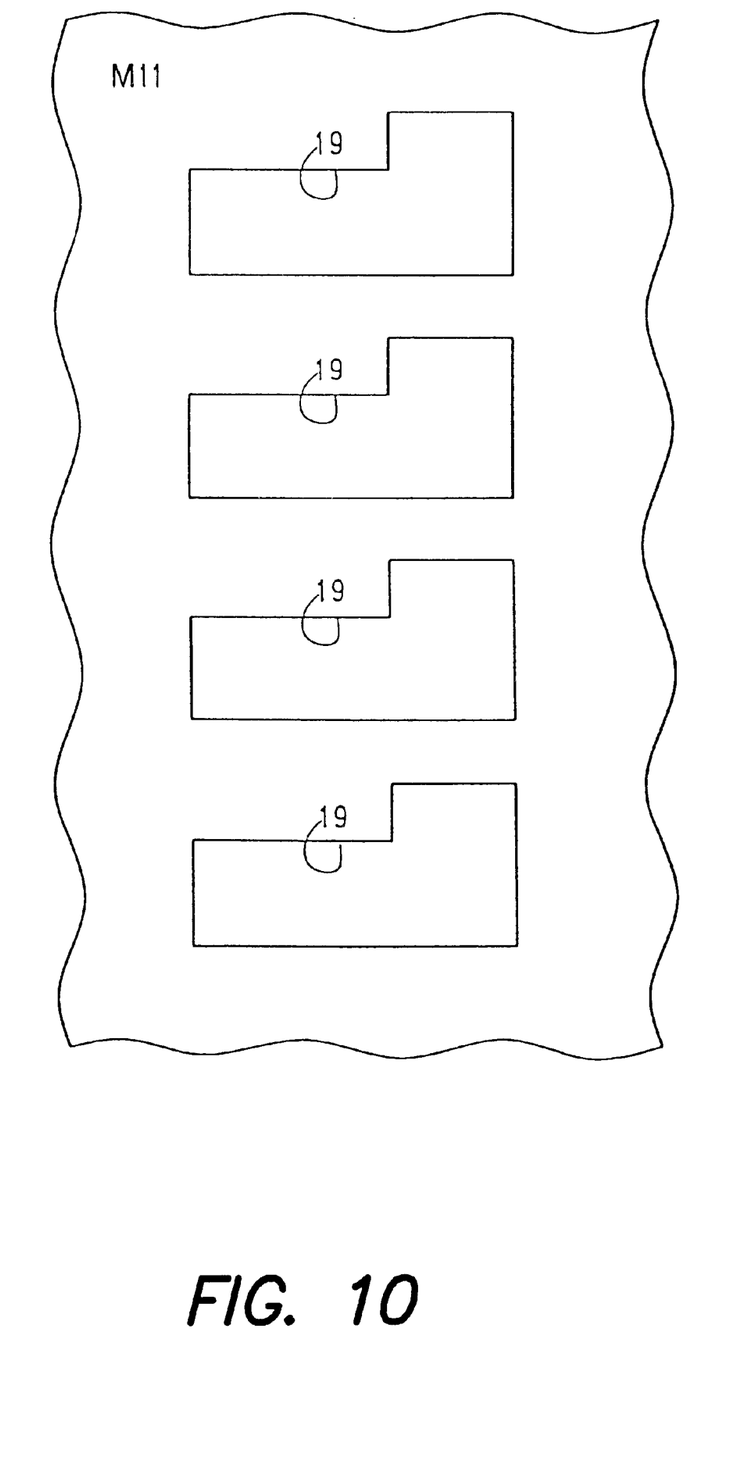
FIG. 10 shows the layout of the modified metal mask of a part of the matrix of FIG. 7.

FIG. 10 shows the layout of the modified metal mask M11 of a part of the matrix of FIG. 7, particularly of the portion wherein the metal lines 9 are formed, which connect each source diffusion to the related word line, to be compared with FIG. 6: each metal 9 is obtained during the manufacturing process by means of the proper openings 19 which define the layout thereof.

A problem connected to such a one mask solution is that a large number of cells is impacted by the same source diffusion: e.g., approximately valuing the source diffusion resistance and considering that the contacts are located only at the two edges, a leakage current equal to 100 $\mu$A generated by the cell in the middle of the source line can produce a voltage drop of at least 0.5 V in case that there are 256 cells in the source diffusion. Then, the measured current, in the case in which the defective cell is exactly in the middle (clearly the problem is reduced as the defective cell nears the external source contact), is not the same as that measured in an unmodified device.

However, even if the current is not exactly the leakage one, it is relevant that the current is zero (or has a relevant variation) when the bit line bias is equal to the word line bias: therefore, the localization of the defective cell is the same as the zero source resistance case.

Figure 11:
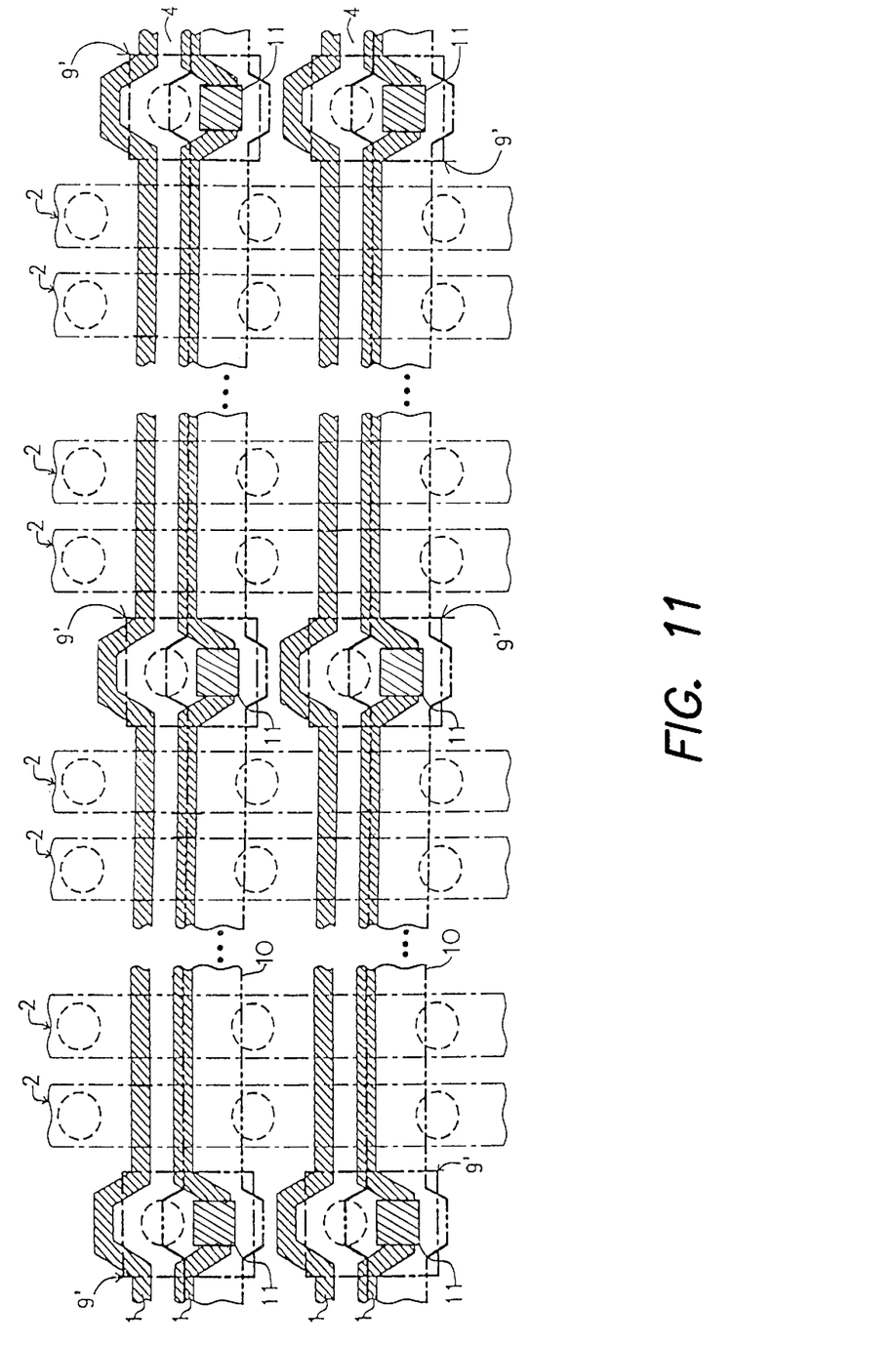
FIG. 11 shows schematically the top view of the same matrix of FIG. 1, modified according to a second embodiment of the present invention.

FIG. 11 shows schematically the top view of the same matrix of FIG. 1, modified according to a second embodiment of the present invention: for solving the problem of the voltage drop on the source diffusion, a structure is formed wherein there is a connection between the word lines and the source diffusions for each source contact.

Such a solution exploits three metal masks 9', 10 and VIAS 11 and so it forms a boot-strap for each source contact; also other mask combinations can be provided in case that, e.g., the boot-strap metals are not available.

The present invention could be integrated in a test package, sold as an integrated system for application to system reliability problems (e.g. Wafer Level Reliability) or defect problems of the process, to keep substrate defect problems under control. In this case there is a device already designed and manufactured, with the modification of only one mask: clearly, the device functionality is endangered (that of the circuitry is not involved). For reducing farther the costs related to device utilization, few wafers of the whole lot can be used or few devices in the whole exposure field can be changed, leaving the others completely functioning.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Method for localizing point defects causing column leakage currents in a non-volatile memory device, said device comprising a plurality of memory cells arranged in rows and columns in a matrix structure, source diffusions, and metal lines which connect said source diffusions to each other, comprising the steps of:

modifying said memory device in order to make said source diffusions independent of each other and each one electrically connected to a respective row;

sequentially biasing single columns of said matrix;

localizing a column to which at least one defective cell belongs, as soon as leakage current flow occurs in the column, to provide a localized column;

while keeping biased said localized column, biasing sequentially single rows of said matrix to a same potential as that of said localized column;

localizing a pair of said cells, wherein at least one of them involves said point defects, as soon as said leakage current flow does not occur.

2. Method according to claim 1, wherein said step of modifying said memory device comprises eliminating said metal lines, and a connection of said source diffusions to each single row is by means of further conductive elements.

3. Method according to claim 2, wherein said connection is obtained by means of modification of first conductive elements which are in said memory device.

4. Method according to claim 3, wherein said first conductive elements are bump contacts of boot-strap circuits which are in said memory device.

5. Method according to claim 4, wherein said boot-strap circuits comprise second conductive elements, operatively connected to said first conductive elements, which extend parallel to said rows and reduce an electrical resistance thereof.

6. In a non-volatile memory device comprising a plurality of memory cells arranged in rows and columns in a matrix structure, and a plurality of source diffusions independent of each other and each connected to a corresponding single word line, a method of localizing point defects causing column leakage currents in the non-volatile memory device, the method comprising acts of:

sequentially biasing single columns of the matrix;

localizing a biased column comprising at least one defective cell when a leakage current is detected in the biased column, to provide a localized column;

sequentially biasing single rows of the matrix to a same potential as the localized column, while maintaining a bias of the localized column;

localizing a pair of cells, at least one of which being the defective cell, when the leakage current is no longer detected in the localized column.

7. The method according to claim 6, wherein the act of sequentially biasing single rows of the matrix comprises sequentially biasing single bit lines of the memory device.

8. The method according to claim 6, wherein the act of sequentially biasing single columns of the matrix comprises sequentially biasing single word lines of the memory device.

9. The method according to claim 8 wherein the act of biasing single word lines of the memory device comprises biasing corresponding source diffusions connected to the word lines.

10. The method according to claim 9, wherein the act of biasing the source diffusions comprises utilizing a memory device comprising bump contacts connecting word lines to boot-strap metal lines, wherein the bump contacts are deformed so as to provide metal lines connecting the word lines to the source diffusions.

* * * * *